United States Patent
Hallak et al.

(10) Patent No.: US 11,239,864 B2
(45) Date of Patent: Feb. 1, 2022

(54) TECHNIQUES FOR IMPROVED ERASURE CODING IN DISTRIBUTED STORAGE SYSTEMS

(71) Applicant: Vast Data Ltd., Tel Aviv (IL)

(72) Inventors: Renen Hallak, Tenafly, NJ (US); Shachar Fienblit, Ein Ayala (IL); Yogev Vaknin, Karkur (IL); Eli Malul, Tirat Hakarmel (IL); Lior Klipper, Tel Aviv (IL)

(73) Assignee: Vast Data Ltd., Tel Aviv (IL)

( * ) Notice: Subject to any disclaimer, the term of this patent is extended or adjusted under 35 U.S.C. 154(b) by 0 days.

(21) Appl. No.: 16/502,690

(22) Filed: Jul. 3, 2019

(65) Prior Publication Data

US 2021/0006269 A1    Jan. 7, 2021

(51) Int. Cl.
*H03M 13/29* (2006.01)
*H03M 13/25* (2006.01)
*G06F 3/06* (2006.01)
*H03M 13/11* (2006.01)

(52) U.S. Cl.
CPC .......... *H03M 13/293* (2013.01); *G06F 3/064* (2013.01); *G06F 3/0608* (2013.01); *G06F 3/0679* (2013.01); *H03M 13/11* (2013.01); *H03M 13/251* (2013.01)

(58) Field of Classification Search
None
See application file for complete search history.

(56) References Cited

U.S. PATENT DOCUMENTS

| | | | | |
|---|---|---|---|---|
| 8,601,339 | B1 * | 12/2013 | Cypher | H03M 13/2918 714/752 |
| 9,026,729 | B1 * | 5/2015 | Hallak | G06F 3/0647 711/114 |
| 2010/0037022 | A1 * | 2/2010 | Chou | G06F 11/1076 711/114 |
| 2016/0011941 | A1 * | 1/2016 | He | H03M 13/293 714/766 |
| 2017/0149890 | A1 | 5/2017 | Shamis et al. | |
| 2018/0246793 | A1 * | 8/2018 | Jin | G06F 11/1076 |

\* cited by examiner

*Primary Examiner* — Cynthia Britt
*Assistant Examiner* — Matthew W Wahlin
(74) *Attorney, Agent, or Firm* — M&B IP Analysts, LLC

(57) ABSTRACT

A system and method for erasure coding. The method includes distributing a plurality of data chunks according to a mirroring scheme, wherein the plurality of data chunks is distributed as a plurality of rows among a plurality of non-volatile memory (NVM) nodes, wherein the mirroring scheme defines a plurality of groups, each group including a subset of the plurality of data chunks, wherein each data chunk in a group has a role corresponding to a relative position of the data chunk within the group, wherein data chunks included in the plurality of groups having the same relative positions within their respective groups have the same role, wherein each row of the plurality of rows includes at least one summation data chunk that is a function of at least one data chunk included in the row and of at least one extra data chunk included in at least one other row.

19 Claims, 3 Drawing Sheets

TECHNIQUES FOR IMPROVED ERASURE CODING IN DISTRIBUTED STORAGE SYSTEMS

TECHNICAL FIELD

The present disclosure relates generally to erasure coding, and more specifically to techniques for improving efficiency of erasure coding in distributed storage systems.

BACKGROUND

Erasure code is a forward error correction code used to control errors for erasures in storage systems. Erasure coding involves transforming an original message split into k chunks into a transformed message having n chunks (where n>k) such that the original message can be recovered from a subset of the transformed message. A systematic erasure code is an erasure code in which the input original message is embedded into the encoded transformed message. The transformed messages include redundant portions of parity data stored across different storage locations that may be used for recovering lost data. A maximum distance separable (MDS) erasure code has the property that any k out of the n symbols is sufficient to recover the original message.

Erasure coding techniques have evolved as storage systems have evolved. In particular, the advent of distributed storage systems has resulted in the development of new erasure coding techniques. When data is recovered using an erasure code in a distributed storage system, data is transferred among at least some of the nodes. As distributed storage systems become more important, further improvements in erasure coding are desired.

It would therefore be advantageous to provide a solution that would provide improved erasure coding techniques.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a method for erasure coding. The method comprises: distributing a plurality of data chunks according to a mirroring scheme, wherein the plurality of data chunks is distributed as a plurality of rows among a plurality of non-volatile memory (NVM) nodes, wherein the mirroring scheme defines a plurality of groups, each group including a subset of the plurality of data chunks, wherein each data chunk in a group has a role corresponding to a relative position of the data chunk within the group, wherein data chunks included in the plurality of groups having the same relative positions within their respective groups have the same role, wherein each row of the plurality of rows includes at least one summation data chunk that is a function of at least one data chunk included in the row and of at least one extra data chunk included in at least one other row.

Certain embodiments disclosed herein also include a non-transitory computer readable medium having stored thereon causing a processing circuitry to execute a process, the process comprising: distributing a plurality of data chunks according to a mirroring scheme, wherein the plurality of data chunks is distributed as a plurality of rows among a plurality of non-volatile memory (NVM) nodes, wherein the mirroring scheme defines a plurality of groups, each group including a subset of the plurality of data chunks, wherein each data chunk in a group has a role corresponding to a relative position of the data chunk within the group, wherein data chunks included in the plurality of groups having the same relative positions within their respective groups have the same role, wherein each row of the plurality of rows includes at least one summation data chunk that is a function of at least one data chunk included in the row and of at least one extra data chunk included in at least one other row.

Certain embodiments disclosed herein also include a system for erasure coding. The system comprises: a processing circuitry; and a memory, the memory containing instructions that, when executed by the processing circuitry, configure the system to: distribute a plurality of data chunks according to a mirroring scheme, wherein the plurality of data chunks is distributed as a plurality of rows among a plurality of non-volatile memory (NVM) nodes, wherein the mirroring scheme defines a plurality of groups, each group including a subset of the plurality of data chunks, wherein each data chunk in a group has a role corresponding to a relative position of the data chunk within the group, wherein data chunks included in the plurality of groups having the same relative positions within their respective groups have the same role, wherein each row of the plurality of rows includes at least one summation data chunk that is a function of at least one data chunk included in the row and of at least one extra data chunk included in at least one other row.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
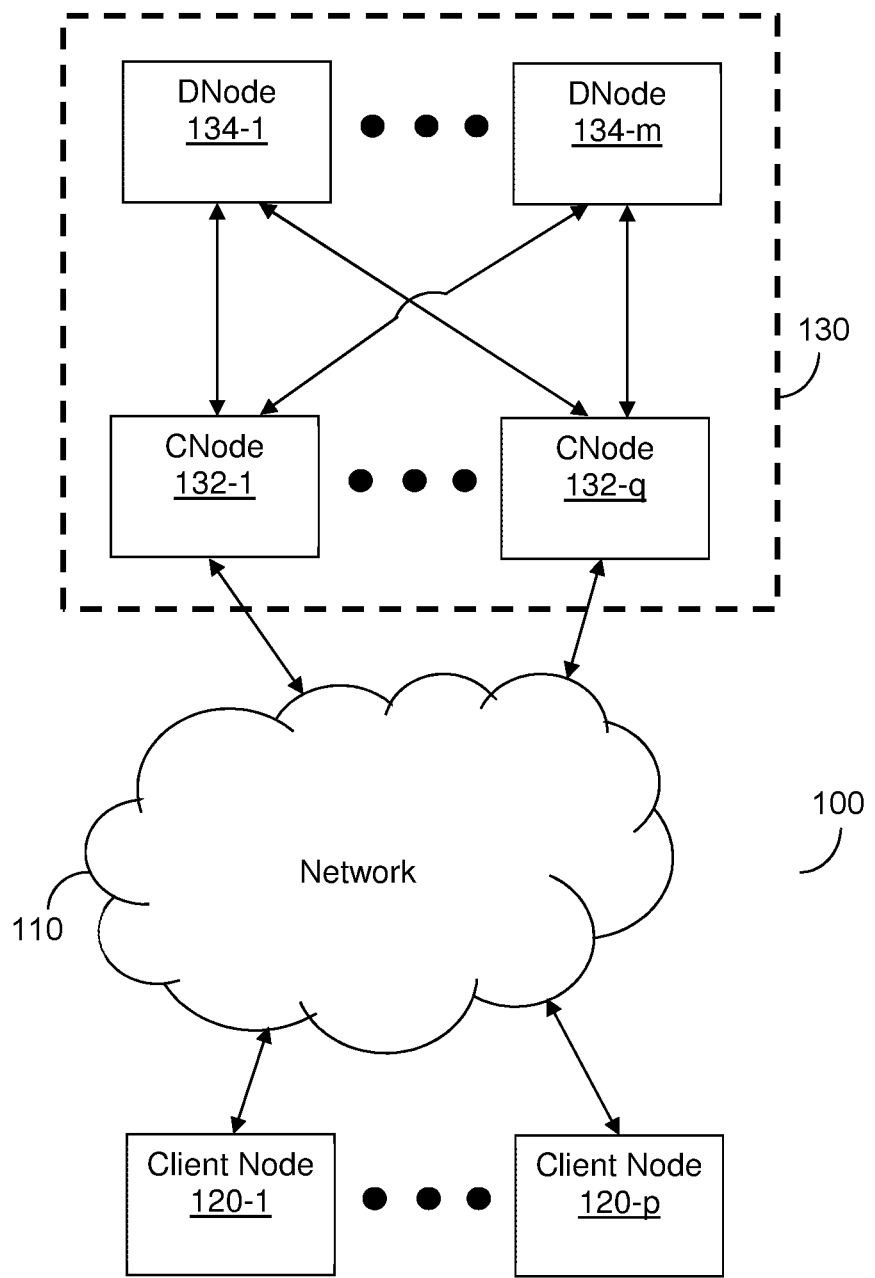
FIG. 1 is an example network diagram utilized to describe various disclosed embodiments.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

It has been identified that existing solutions for erasure coding in distributed storage systems require an exponential number of blocks per storage node in order to optimize use of bandwidth. For example, an optimal erasure coding scheme according to existing solutions may require $2^{150}$ blocks per drive when data is distributed among 150 drives. As a result, providing an optimal erasure coding scheme is impractical for most real-world solutions. The disclosed embodiments provide techniques that reduce the number of storage nodes needed to optimize erasure coding and, therefore, provide improved performance at least with respect to bandwidth.

The various disclosed embodiments include techniques for improved erasure coding in distributed storage systems. The disclosed embodiments utilize a mirroring scheme that is realized by distributing groups of data chunks among non-volatile memory (NVM) nodes. Each NVM node includes non-volatile memory in the form of, for example but not limited to, a disk or drive. More specifically, the NVM nodes include systematic nodes storing systematic data and parity nodes storing parity data. The groups of data chunks include data chunks stored in the systematic nodes. Each data chunk is a portion of data such as, but not limited to, a block or other minimum unit of storage data.

The parity data chunks include summation data chunks. Each summation data chunk is a function of a portion of the systematic data chunks. More specifically, data in the NVM nodes is distributed as stripes. Each stripe includes data chunks distributed among the systematic nodes and the parity nodes. Each stripe further includes one or more rows. Each row is a set of data blocks, each data block in one of the nodes. As a non-limiting example, when the NVM nodes includes 4 systematic nodes and 2 parity nodes, a row may include one data chunk stored in each node, or 6 data chunks total, and a stripe includes one or more of those rows.

At least some of the summation data chunks are functions of systematic data chunks in the same stripe as well as one or more extra data chunks. Each extra data chunk for a summation data chunk is a systematic data chunk stored in a different stripe than the summation data chunk. The number of extra data chunks that a summation data chunk is a function of may be based on, for example, a number of parity nodes and a number of stripes being used.

Table 1 illustrates an example data chunk layout utilized to describe summation data as discussed herein.

TABLE 1

| SN0 | SN1 | SN2 | SN3 | PN0 | PN1 |
|---|---|---|---|---|---|
| $a_{0,0}$ | $a_{0,1}$ | $a_{0,2}$ | $a_{0,3}$ | $f(a_{0,0}, a_{0,1}, a_{0,2}, a_{0,3})$ | $g(a_{0,0}, a_{0,1}, a_{0,2}, a_{0,3}) \oplus a_{3,0} \oplus a_{1,2}$ |
| $a_{1,0}$ | $a_{1,1}$ | $a_{1,2}$ | $a_{1,3}$ | $f(a_{1,0}, a_{1,1}, a_{1,2}, a_{1,3})$ | $g(a_{1,0}, a_{1,1}, a_{1,2}, a_{1,3}) \oplus a_{2,0} \oplus a_{0,3}$ |
| $a_{2,0}$ | $a_{2,1}$ | $a_{2,2}$ | $a_{2,3}$ | $f(a_{2,0}, a_{2,1}, a_{2,2}, a_{2,3})$ | $g(a_{2,0}, a_{2,1}, a_{2,2}, a_{2,3}) \oplus a_{0,1} \oplus a_{3,2}$ |
| $a_{3,0}$ | $a_{3,1}$ | $a_{3,2}$ | $a_{3,3}$ | $f(a_{3,0}, a_{3,1}, a_{3,2}, a_{3,3})$ | $g(a_{3,0}, a_{3,1}, a_{3,2}, a_{3,3}) \oplus a_{1,1} \oplus a_{2,3}$ |

In Table 1, data is distributed among NVM nodes including systematic nodes (SNs) 0 through 3 and parity nodes (PNs) 0 and 1. Each column of Table 1 corresponds to a NVM node and each row of Table 1 corresponds to a row of a stripe. Thus, Table 1 demonstrates a stripe including 4 rows. The systematic nodes 0 through 3 include systematic data chunks $a_{0,0}$ through $a_{3,3}$. Each of functions f and g is a summation function. In an embodiment, f and g are different functions. In an example implementation, f and g are functions according to Reed-Solomon error correction codes.

In Table 1, parity node 0 includes data chunks which are functions of systematic data in their respective rows. In an example implementation, f is a summation of the systematic data chunks in the same row. For example, the data chunk stored in parity node 0 belonging to the first row stores $f(a_{0,0}, a_{0,1}, a_{0,2}, a_{0,3})$.

In Table 1, parity node 1 includes summation data chunks which are functions of systematic data chunks in their respective rows as well as of extra data in one or more other rows. For example, the data chunk stored in parity node 1 belonging to the first row stores $g(a_{0,0}, a_{0,1}, a_{0,2}, a_{0,3}) \oplus a_{2,0} \oplus_{1,2}$. In an example implementation, g is a summation of the systematic data chunks in the same row and the operations $\oplus$ are summations over extra data chunks (e.g., for the first row of parity node 1, the summation data chunk is a function of extra data chunks $a_{2,0}$ and $a_{1,2}$). More specifically, in an example implementation, the operations $\oplus$ are summations over Galois field.

Storing parity data that is a function of extra data chunks stored in other rows allows for rebuilding while reducing the amount of redundant data needed. For example, when systematic node 0 has failed, the data chunk $a_{2,0}$ may be recovered by subtracting $g(a_{0,0}, a_{0,1}, a_{0,2}, a_{0,3})$ and $a_{1,2}$ from the data in parity node 1.

Each data chunk of a group has a role, where the role of a data chunk corresponds to a relative position of the data chunk within the group. The groups are mirrored such that each data chunk in a group has the same role as each data chunk having the same relative position in each of the other groups. Table 2 illustrates an example data chunk layout utilized to describe groups of data chunks.

TABLE 2

| SN0 | SN1 | SN2 | SN3 | SN4 | SN5 | SN6 | SN7 | PN0 | PN1 |
|---|---|---|---|---|---|---|---|---|---|
| $a_{0,0}$ | $a_{0,1}$ | $a_{0,2}$ | $a_{0,3}$ | $a_{0,4}$ | $a_{0,5}$ | $a_{0,6}$ | $a_{0,7}$ | $F_0$ | $g_0 \oplus a_{3,0} \oplus a_{1,2} \oplus a_{2,4} \oplus a_{1,6}$ |
| $a_{1,0}$ | $a_{1,1}$ | $a_{1,2}$ | $a_{1,3}$ | $a_{1,4}$ | $a_{1,5}$ | $a_{1,6}$ | $a_{1,7}$ | $F_1$ | $g_1 \oplus a_{2,0} \oplus a_{0,3} \oplus a_{3,4} \oplus a_{0,7}$ |
| $a_{2,0}$ | $a_{2,1}$ | $a_{2,2}$ | $a_{2,3}$ | $a_{2,4}$ | $a_{2,5}$ | $a_{2,6}$ | $a_{2,7}$ | $F_2$ | $g_2 \oplus a_{1,1} \oplus a_{3,2} \oplus a_{0,6} \oplus a_{3,7}$ |
| $a_{3,0}$ | $a_{3,1}$ | $a_{3,2}$ | $a_{3,3}$ | $a_{3,4}$ | $a_{3,5}$ | $a_{3,6}$ | $a_{3,7}$ | $F_3$ | $g_3 \oplus a_{0,1} \oplus a_{2,3} \oplus a_{1,5} \oplus a_{2,7}$ |

In Table 2, the layout shown in Table 1 has been expanded to further illustrate additional systematic nodes 4 through 7. Functions f and g are summation functions as described with respect to Table 1 that are functions of systematic data chunks in their respective rows. For example, $f_0$ is the function $f(a_{0,0}, a_{0,1}, a_{0,2}, a_{0,3}, a_{0,4}, a_{0,5}, a_{0,6}, a_{0,7})$ and $g_0$ is the function $g(a_{0,0}, a_{0,1}, a_{0,2}, a_{0,3}, a_{0,4}, a_{0,5}, a_{0,6}, a_{0,7})$. The summation data chunks stored in parity node 1 are also functions of one or more extra data chunks. In Table 2, the parity data chunk in the first row of parity node 1 is further based on summations of $a_{2,4}$ and $a_{1,6}$ in addition to summations of the extra data chunks used in the first row of parity node 1 in Table 1.

In an example implementation, the mirroring scheme defines groups of 4 systematic data chunks. For example, a first group includes $a_{0,0}$ through $a_{0,3}$ and a second group includes $a_{0,4}$ through $a_{0,7}$. Relative positions in each group may be in the form of, for example, first through fourth positions (e.g., $a_{0,0}$ may be in the first position and $a_{0,3}$ may be in the fourth position) with respect to an order of the systematic nodes (i.e., the first position would correspond to the first systematic node in the order and the fourth position would correspond to the fourth systematic node in the order). As an example, $a_{0,0}$ and $a_{0,4}$ are both in the first position of their respective groups and, therefore, have the same role.

In an embodiment, the extra data chunks do not include all of the systematic data chunks. More specifically, in a further embodiment, the number of systematic data chunks excluded from use as extra data chunks (i.e., systematic data chunks for which no summation data chunk uses the systematic data chunk as an extra data chunk) is inversely proportional to the number of parity nodes.

In an embodiment, the number of extra data chunks stored in each row for each parity node storing extra data chunks is based on the number of rows, which in turn is based on the number of parity nodes. To this end, the number of rows that are used may be equal to $r^{(k'/r)}$, where r is the number of parity nodes and k' is the optimal number of systematic data nodes. A number of data duplications stored by the parity nodes may be equal to the total number of NVM nodes divided by k'. To this end, the total number of extra data chunks across all rows may be determined as:

$$e_t = d * (w * k') / \left(1 - \frac{1}{r}\right) \quad \text{Equation 1}$$

In Equation 1, $e_t$ is the total number of extra data chunks, d is the number of data duplications, and w is the number of rows. The number of extra data chunks per row $e_w$ may therefore be determined as equal to $e_t$ divided by the number of stripes s. Accordingly, the number of extra data chunks per summation function may be determined as:

$$e_{sw} = e_w/(r-1) \quad \text{Equation 2}$$

In Equation 2, $e_{sw}$ is the number of extra data chunks per parity node per row storing extra data chunks. For example, as shown in Table 2, $e_{sw}$ is equal to 4 (i.e., parity node 1, which is the only parity node storing extra data chunks, stores 4 extra data chunks for each row partially distributed therein).

In an embodiment, the locations in the parity nodes to be used for storing extra data chunks may be determined using the following algorithm:

Algorithm 1

```
for i from 0 to w:
    if (((x * y) <= (i % (y * z))) && ((x + 1) * y > (i % (y *
    storageUnitsInColumn)))):
        L_{nodeNumber} = L_{nodeNumber} ∪ {i}
        lineIdx++
    else
        E = E ∪ {i}
        contentIdx++
```

In algorithm 1, w is the number of rows, x, y, and z are determined as described below; $L_{nodeNumber}$ indicates each row to which extra elements should be added; E indicates each data chunk that should be an extra data chunk (i.e., each data chunk that should store an extra element); and each of lineIdx and contentIdx are counters initialized with a value of zero. Once the algorithm has been run, for each party, one element is selected from E in each $L_{nodeNumber}$ in each storage node and added to the extra data chunks. Accordingly, the results of algorithm 1 are the rows and locations within parity nodes in which extra elements are to be stored.

In a further embodiment, x, y, and z may be determined according to the following equations.

$$x = n_{node} \% r \quad \text{Equation 3}$$

In Equation 3, $n_{node}$ is a total number of nodes and r is the number of parity nodes.

$$y = 4^{2-q} \quad \text{Equation 4}$$

The value of q is determined according to the following equation:

$$q = \frac{n_{node} \% k'}{r} \quad \text{Equation 5}$$

In Equation 5, $n_{node}$ is a total number of nodes, k' is the optimal number of systematic data nodes, and r is the number of parity nodes. Lastly, z is determined according to the following equation:

$$z = \frac{k'}{r-1} \quad \text{Equation 6}$$

The disclosed embodiments provide erasure coding techniques that reduce the number of sets of data required to be distributed across nodes in a distributed storage system. More specifically, the number of rows and, therefore, stripes needed to ensure sufficient redundancy is reduced. As a result, the amount of redundant data needed to be stored is reduced. Further, the reduction in data also results in optimizing bandwidth used for rebuilding using the erasure coding at least due requiring a fewer number of data chunks to be read. As a result, the disclosed embodiments allow for erasure coding for a large number of storage nodes without having an exponential number of rows or stripes.

In particular, using extra data chunks as described herein reduces the rebuild ratio. In at least some implementations, the disclosed embodiments demonstrate a rebuild ratio of 0.5*k+r(2), where k is the number of systematic nodes and r is the number of parity nodes. This provides an optimal or otherwise improved erasure coding.

FIG. 1 is a network diagram 100 illustrating an example distributed storage system utilized to describe various disclosed embodiments. The network diagram 100 includes a distributed storage system 130, a network 110, and client nodes 120-1 through 120-p (referred to as a client node 120 or as client nodes 120 for simplicity).

The distributed storage system 130 includes compute nodes (CNodes) 132-1 through 132-q (referred to as a CNode 132 or as CNodes 132 for simplicity) and storage nodes (DNodes) 134-1 through 134-m (referred to as a DNode 134 or as DNodes 134 for simplicity). In an example implementation, the distributed storage system 130 may be configured as described further in U.S. patent application Ser. No. 16/001,576, assigned to the common assignee, the contents of which are hereby incorporated by reference.

The network 110 may be, but is not limited to, a wireless, cellular or wired network, a local area network (LAN), a wide area network (WAN), a metro area network (MAN), the Internet, the worldwide web (WWW), similar networks, and any combination thereof. The client node 120 may be, but is not limited to, a server, a personal computer, a laptop, a tablet computer, a smartphone, or any other device configured to store data, access data, or both.

The DNodes 134 include at least non-volatile memories (e.g., Flash, 3D Xpoint), and may be realized as combinations of volatile (e.g., RAM) and non-volatile memories. The non-volatile memories may be included in, for example, hard-disk drives (HDDs), solid state drives (SSDs), or a combination thereof. In an example implementation, each DNode 134 includes one or more drives containing disks (not shown).

The CNodes 132 are configured to access data in the DNodes 134. In some implementations, the CNodes 132 may be configured to collectively act as a distributed transaction manager for accessing data in the DNodes 134. An example schematic diagram of a CNode 132 is described below with respect to FIG. 3.

The client node 120 is configured to send access commands to the distributed storage system 130 via the network 110. The CNodes 132 are configured to receive access commands from the client nodes 120 and to access the DNodes 134 based on the received commands. The access may include translating the received commands into a format supported by the DNodes 134. As a non-limiting example, NVM Express (NVMe) over Fabrics may be utilized to enable such access.

In an example implementation, each CNode 132 may access all DNodes 134. In a further example implementation, each CNode 132 is configured to read any data stored in any of the DNodes 134 and is configured to write data to one or more assigned portions of data stored in the DNodes 134.

In an embodiment, a CNode 132 is configured to store erasure coding data in the DNodes 134 using a mirroring scheme as described herein. To this end, the CNode 132 is assigned to one or more sets of data (e.g., stripes or rows) in the DNodes 134 used for erasure coding is configured to maintain a mapping of each of its erasure coding datasets to the location in the DNodes 134 of any free user data included in those datasets. Each CNode 132 may further maintain data indicating whether each of its assigned erasure coding datasets includes free user data. The mapping and indication data may be stored in the respective CNode 132 or in the DNodes 134.

In an embodiment, each CNode 132 is configured to allocate data using an erasure coding scheme that reduces use of space or optimizes the locality of its erasure code stripes. Data is distributed across non-volatile memory (NVM) nodes. Each NVM node is a unit of non-volatile memory and may be one of the DNodes 134 or a portion thereof. In an example implementation, each NVM node is a drive (not shown) in one of the DNodes 134.

Erasure coding data including systematic data and parity data is split into data chunks and stored across NVM nodes among the DNodes 134. In an example implementation, the erasure coding data is distributed via stripes such that each stripe includes data chunks stored in multiple NVM nodes. Each stripe is distributed across n total NVM nodes and includes one or more rows. Each row includes one data chunk in each of the n NVM nodes. To this end, for each row, its systematic data chunks are distributed across k systematic nodes (each systematic node storing a chunk of the row's systematic data). Parity data chunks are generated and distributed across r parity nodes to provide redundancy for the systematic data such that n−k=r.

In an embodiment, data is distributed among the rows according to a mirroring scheme. The mirroring scheme is based on groups of the data chunks in the rows. Each data chunk has a role corresponding to its relative position within a group such that data chunks having the same role also have the same relative positions within their respective groups. Parity data in each row includes one or more data chunks that are functions of data in the row as well as one or more data chunks that are functions of data chunks in the row and extra data chunks included in one or more other rows.

The number of extra data chunks used may vary among parity data chunks (e.g., a first parity data chunk may be a function of 4 extra data chunks while a second parity data chunk may be a function of 2 extra data chunks). The total number of extra data chunks needed may be based on the number of rows and total number of parity nodes.

It should be noted that the embodiments described herein are not limited to the arrangement shown in FIG. 1. For example, storage systems to which the disclosed erasure coding techniques may be applied are not limited to the particular configuration of the distributed storage system 130. In particular, a storage system used for the improved erasure coding techniques described herein may utilize a single compute node for managing the multiple storage nodes without departing from the scope of the disclosure.

Figure 2:
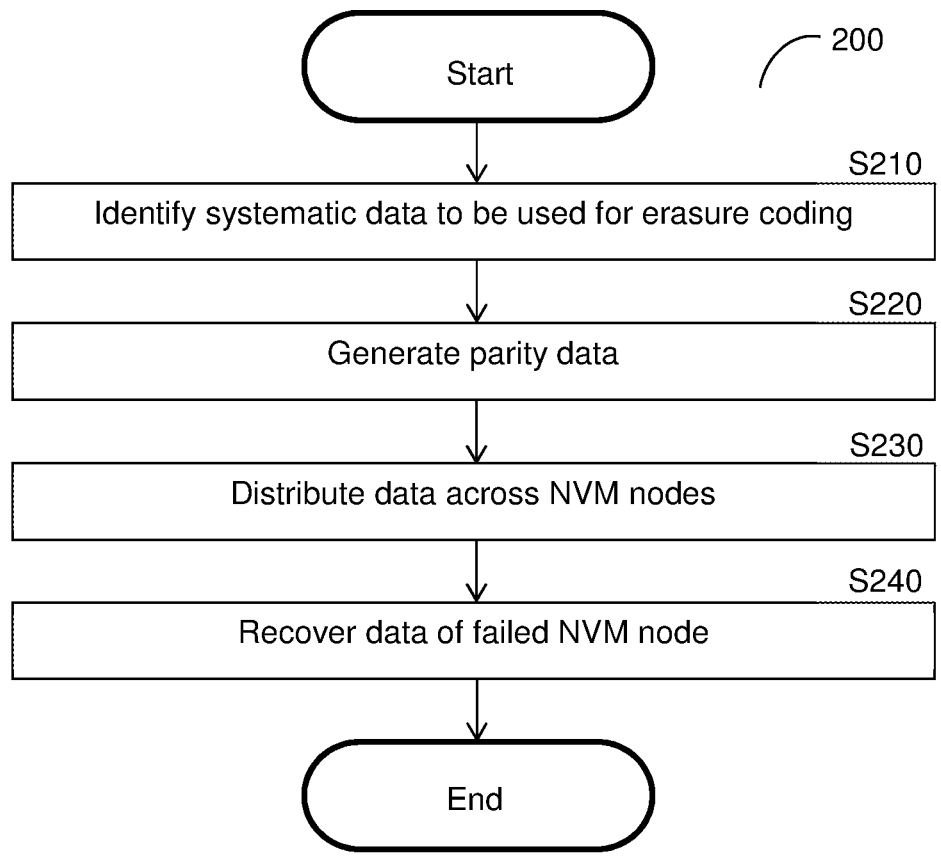
FIG. 2 is a flowchart illustrating a method for improved erasure coding according to an embodiment.

FIG. 2 is an example flowchart illustrating a method for using free space to improve locality of an erasure code according to an embodiment. In an embodiment, each CNode 132, FIG. 1, may be configured to perform the method with respect to a corresponding set of rows including erasure code data and parity data such that the CNodes collectively cause distribution of data according to an entire mirroring scheme.

At S210, systematic data to be used for erasure coding is identified. The identified data includes systematic data that is to be included in one or more rows, and may further include systematic data already stored in the one or more rows.

At S220, based on the identified erasure coding data, parity data is generated for each row. The parity data includes one or more sets of parity data chunks that are functions of systematic data in the same row. The parity data also includes one or more sets of parity data chunks that are each a function of systematic data in the same row and of one or more extra data chunks in other rows. To this end, in an embodiment, S220 includes calculating parity data based on the identified erasure coding data.

At S230, data is distributed across non-volatile memory (NVM) nodes. The distributed data includes the generated parity data and may further include at least a portion of the identified systematic data (e.g., when the systematic data is data to be stored). The data is distributed according to a mirroring scheme as described herein. Specifically, the distributed data includes systematic data chunks assigned to groups. The systematic data chunks have roles corresponding to their relative positions within their respective groups as described above. The mirroring scheme defines these groups such that systematic data chunks in the same relative positions within their respective groups have the same roles.

At optional S240, when one of the NVM nodes fails, data of the failed NVM node may be recovered based on the distributed data. In an example implementation, one or more data chunks stored in the failed NVM node may be recovered by subtracting one or more extra data chunks from the parity data that is a function of the extra data chunks.

Figure 3:
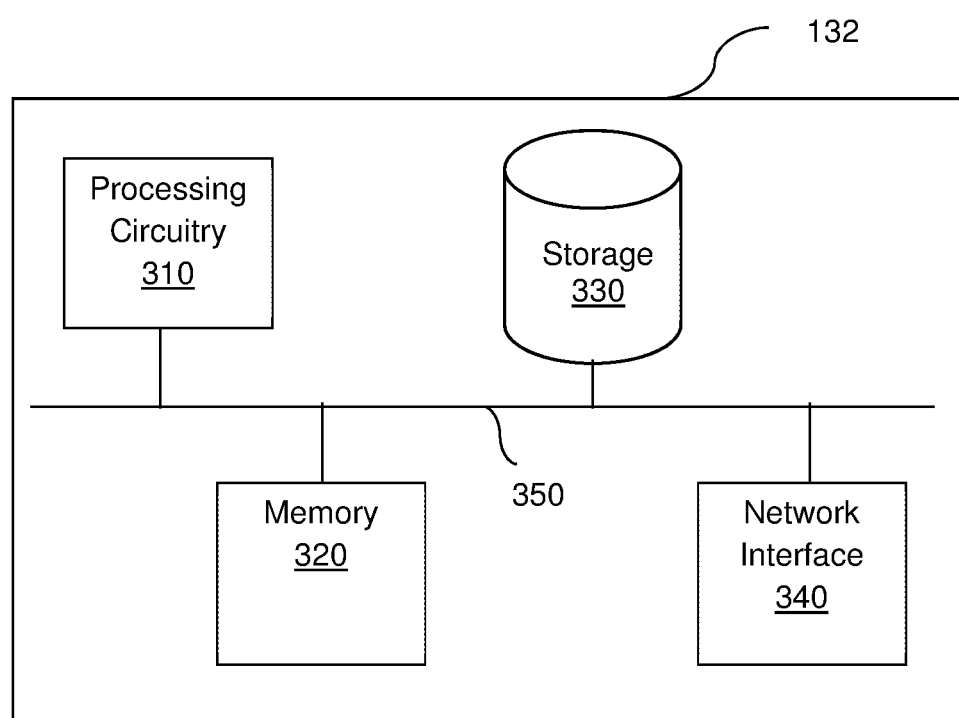
FIG. 3 is a schematic diagram of a compute node according to an embodiment.

FIG. 3 is an example schematic diagram of a CNode 132 according to an embodiment. The CNode 132 includes a processing circuitry 310 coupled to a memory 320, a storage 330, and a network interface 340. In an embodiment, the components of the CNode 132 may be communicatively connected via a bus 350.

The processing circuitry 310 may be realized as one or more hardware logic components and circuits. For example, and without limitation, illustrative types of hardware logic components that can be used include field programmable gate arrays (FPGAs), application-specific integrated circuits (ASICs), Application-specific standard products (ASSPs), system-on-a-chip systems (SOCs), general-purpose microprocessors, microcontrollers, digital signal processors (DSPs), and the like, or any other hardware logic components that can perform calculations or other manipulations of information.

The memory 320 may be volatile (e.g., RAM, etc.), non-volatile (e.g., ROM, flash memory, NVRAM, etc.), or a combination thereof. In one configuration, computer readable instructions to implement one or more embodiments disclosed herein may be stored in the storage 330.

In another embodiment, the memory 320 is configured to store software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the processing circuitry 310, cause the processing circuitry 310 to perform the various processes described herein.

The storage 330 may be magnetic storage, optical storage, and the like, and may be realized, for example, as flash memory or other memory technology, CD-ROM, Digital Versatile Disks (DVDs), or any other medium which can be used to store the desired information.

The network interface 340 allows the CNode 120 to receive access commands and send data over, for example, the network 110, FIG. 1.

It should be understood that the embodiments described herein are not limited to the specific architecture illustrated in FIG. 3, and other architectures may be equally used without departing from the scope of the disclosed embodiments.

It should be noted that various embodiments are discussed with respect to stripes and rows distributed across nodes such as disks merely for simplicity purposes, but that other non-volatile memories or portions thereof may be equally utilized as nodes storing erasure code data without departing from the disclosed embodiments.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; 2A; 2B; 2C; 3A; A and B in combination; B and C in combination; A and C in combination; A, B, and C in combination; 2A and C in combination; A, 3B, and 2C in combination; and the like.

What is claimed is:

1. A method for erasure coding, comprising:
distributing a plurality of data chunks according to an erasure coding scheme, wherein the plurality of data chunks includes systematic data chunks and parity chunks that are distributed across a plurality of rows and a plurality of columns, wherein each column of the plurality of columns corresponds to an NVM node of a plurality of non-volatile memory (NVM) nodes, wherein each row of the plurality of rows includes a first parity chunk including a first function of systematic data chunks of the row, and at least one second parity chunk that includes a second function of the systematic data chunks included in the row and of at least one extra data chunk included in at least one other row, wherein different rows include second parity chunks that are functions of different extra data chunks; and
determining for each data chunk included in a first portion of the plurality of data chunks, whether the data chunk is to be used as an extra data chunk, wherein the determining includes utilizing a formula that is based at least on a row index of the data chunk and a number of parity chunks per row.

2. The method of claim 1 further comprising: defining a plurality of groups, each group including a subset of the plurality of columns, wherein each column in each group is associated with a corresponding column in another group, wherein each group is defined with respect to an order of at least one NVM node of the plurality of NVM nodes, wherein the relative position of each data chunk within a group is based on the order of the group and the NVM node to which the data chunk belongs.

3. The method of claim 1, wherein the plurality of NVM nodes includes a number of parity nodes, wherein a total number of extra data chunks is based on the number of parity nodes.

4. The method of claim 1, wherein a number of extra data chunks for each second parity chunk is based on the number of parity chunks per row and a number of rows of the plurality of rows.

5. The method of claim 1 further comprising:
in a case where it is determined that the data chunk is not to be used as an extra data chunk, determining whether the data chunk is to be used as a second parity chunk.

6. The method of claim 1, wherein the formula includes an exponential portion that is based on the number of parity chunks per row.

7. The method of claim 1, wherein the formula is further based on a column index of the data chunk.

8. The method of claim 1, wherein the formula is further based on a number (K') of NVM nodes included in the first portion of the plurality of data chunks.

9. The method of claim 1 further comprising:
executing an algorithm that iterates the determining for each NVM node included in the first portion of the plurality of data chunks and produces determination results; and
adjusting the determination results of the algorithm to data chunks included in a second portion of the plurality of data chunks, to determine extra data chunks for the second portion, wherein each extra data chunk determined for the second portion participates in a same parity chunk as a corresponding extra data chunk in the first portion.

10. A non-transitory computer readable medium having stored thereon instructions for causing a processing circuitry to execute a process, the process comprising:
distributing a plurality of data chunks according to an erasure coding scheme, wherein the plurality of data chunks includes systematic data chunks and parity chunks that are distributed as a plurality of rows and a plurality of columns, wherein each column of the plurality of columns corresponds to an NVM node of a plurality of non-volatile memory (NVM) nodes, wherein each row of the plurality of rows includes a first parity chunk including a first function of systematic data chunks of the row, and at least one second parity chunk that includes a second function of the systematic data chunks included in the row and of at least one extra data chunk included in at least one other row; wherein different rows include second parity chunks that are functions of different extra data chunks; and
determining for each data chunk included in a first portion of the plurality of data chunks, whether the data chunk is to be used as an extra data chunk, wherein the determining includes utilizing a formula that is based at least on a row index of the data chunk and a number of parity chunks per row.

11. A system for erasure coding, comprising:
a processing circuitry; and
a memory, the memory containing instructions that, when executed by the processing circuitry, configure the system to:
distribute a plurality of data chunks according to an erasure coding scheme, wherein the plurality of data chunks includes systematic data chunks and parity chunks that are distributed as a plurality of rows and a plurality of columns, wherein each column of the plurality of columns corresponds to an NVM node of a plurality of non-volatile memory (NVM) nodes, wherein each row of the plurality of rows includes a first parity chunk including a first function of systematic data chunks of the row, and at least one second parity chunk that includes a second function of the systematic data chunks included in the row and of at least one extra data chunk included in at least one other row, wherein different rows include second parity chunks that are functions of different extra data chunks; and
determine for each data chunk included in a first portion of the plurality of data chunks, whether the data chunk is to be used as an extra data chunk, wherein the determination includes utilizing a formula that is based at least on a row index of the data chunk and a number of parity chunks per row.

12. The system of claim 11 is further configured to: define a plurality of groups, each group including a subset of the plurality of columns, wherein each column in each group is associated with a corresponding column in another group, wherein each group is defined with respect to an order of at least one NVM node of the plurality of NVM nodes, wherein the relative position of each data chunk within a group is based on the order of the group and the NVM node to which the data chunk belongs.

13. The system of claim 11, wherein the plurality of NVM nodes includes a number of parity nodes, wherein a total number of extra data chunks is based on the number of parity nodes.

14. The system of claim 11, wherein a number of extra data chunks for each second parity chunk is based on the number of parity chunks per row and a number of rows of the plurality of rows.

15. The system of claim 11 is further configured to:
determine whether the data chunk is to be used as a second parity chunk, in a case where it is determined that the data chunk is not to be used as an extra data chunk.

16. The system of claim 11, wherein the formula includes an exponential portion that is based on the number of parity chunks per row.

17. The system of claim 11, wherein the formula is further based on a column index of the data chunk.

18. The system of claim 11, wherein the formula is further based on a number (K') of NVM nodes included in the first portion of the plurality of data chunks.

19. The system of claim 11 is further configured to:
execute an algorithm that iterates the determination for each NVM node included in the first portion of the plurality of data chunks and produces determination results; and
adjust the determination results of the algorithm to data chunks included in a second portion of the plurality of data chunks, to determine extra data chunks for the second portion, wherein each extra data chunk determined for the second portion participates in a same parity chunk as a corresponding extra data chunk in the first portion.

* * * * *